United States Patent
Song et al.

(10) Patent No.: US 8,519,543 B1
(45) Date of Patent: Aug. 27, 2013

(54) LARGE SIZED SILICON INTERPOSERS OVERCOMING THE RETICLE AREA LIMITATIONS

(75) Inventors: Haoyu Song, Cupertino, CA (US); Cao Wei, Cupertino, CA (US); Rui Niu, Cupertino, CA (US); Anwar A. Mohammed, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/551,466

(22) Filed: Jul. 17, 2012

(51) Int. Cl.
*H01L 23/48* (2006.01)

(52) U.S. Cl.
USPC .......................................... 257/774; 257/700

(58) Field of Classification Search
USPC ................................................. 257/700, 774
See application file for complete search history.

(56) References Cited

U.S. PATENT DOCUMENTS

| | | | |
|---|---|---|---|
| 8,269,350 B1 * | 9/2012 | Chen et al. | 257/774 |
| 2011/0108948 A1 * | 5/2011 | Kim et al. | 257/532 |
| 2013/0063848 A1 * | 3/2013 | Thorpe et al. | 361/63 |

* cited by examiner

*Primary Examiner* — David Vu
*Assistant Examiner* — Brandon Fox
(74) *Attorney, Agent, or Firm* — Robert D. McCutcheon

(57) ABSTRACT

A multi-die integrated circuit assembly includes an interposer substrate larger than the typical reticle size used in fabricating the "active area" in which the through-silicon vias (TSVs) and interconnect conductors are formed in the interposer. At the same time, each of the dies has its external power/ground and I/O signal line connections concentrated into a smaller area of the die. The dies are disposed or mounted on the interposer such that these smaller areas (with the power/ground/IO connections) overlap with the active area of the interposer. In this configuration, a plurality of dies having a combined area substantially greater than the active area of the interposer can be mounted on the interposer (and take advantage of the active area for interconnections).

14 Claims, 2 Drawing Sheets

LARGE SIZED SILICON INTERPOSERS OVERCOMING THE RETICLE AREA LIMITATIONS

TECHNICAL FIELD

The present disclosure relates to interconnect technology, and more particularly, to methods and silicon interposer structures for use in multi-die integrated circuit packaging.

BACKGROUND

A 2D integrated circuit package (2D IC package) is a single package constructed by mounting multiple semiconductor wafers/dies/chips and interconnecting them horizontally to function as a single device or system. A 3D integrated circuit package (3D IC package) or 3 dimensional stack integrated circuit package (3DS IC package) is a single integrated package constructed by stacking vertically separate semiconductor wafers/dies/chips and interconnecting them to function as a single device or system. In many designs, through-silicon via (TSV) technology enables the interconnections between the multiple semiconductor wafers/dies/chips and the resulting incorporation of substantial functionality into a relatively small package. As will be appreciated, the wafers/dies/chips may be heterogeneous. For reference, a 3D integrated circuit (3D IC) is a single wafer/die/chip having two or more layers of active electronic components integrated vertically and horizontally into a single circuit.

Recently, a different multi-die package has been developed. This type of package is sometimes referred to as a 2.5D integrated circuit package (2.5D IC package). In a 2.5D IC package, multiple wafers/dies/chips are mounted on an "interposer" structure. Multiple dies are placed on a passive silicon interposer which is responsible for the interconnections between the dies, as well as the external I/Os through the use of TSV technology. This design is superior to the 3D IC package due to lower cost and better thermal performance. As will be appreciated, each "die" can be a 2D IC package or even a 3D IC or 3D IC package.

Turning to FIG. 1, there is provided a cross-sectional diagram illustrating a conventional 2.5D IC package 100. The 2.5D IC package 100 includes multiple dies 102 having multiple electrical connections 110 (e.g., microbumps) to an interposer substrate 104 for carrying power, ground and/or other signals. The interposer substrate 104 may be constructed of any suitable material that provides multiple electrical conductors extending therethrough from one side to the other side. The interposer substrate 104 also includes multiple connections 112 (e.g., bumps) to a package substrate 106. Package substrate 106 includes multiple connections 114 (e.g., BGA solder balls).

Included within the interposer substrate 104 are a plurality of electrical conductor lines (not shown) extending therethrough and therein. The conductors are configured and structured to provide a desired interconnect pattern or matrix between and among the connections 110 and the connections 112. In one embodiment, the substrate 104 is a silicon interposer constructed using TSV technology.

Limited by the photolithography reticle size (masking and pattern size), the maximum silicon interposer substrate size that can be achieved is about 25 mm×31 mm. In potential high end network applications, if 2.5D IC packaging were to be used, multiple large flip-chip mounted dies would need to be placed side by side on the interposer substrate. This would require use of a larger interposer substrate (e.g. 45 mm×45 mm). However, this size of interposer substrate is either not readily manufactured or would require a specialized photolithography process which will significantly increase costs (and likely lower yield).

Accordingly, there is needed a method and interposer substrate packaging configuration to be used in manufacturing a multi-die package using conventional or current photolithography technology.

SUMMARY

In accordance with one embodiment, there is provided a multi-die integrated circuit assembly having a substrate having a plurality of connections, and a silicon interposer disposed above the substrate. The silicon interposer includes a first portion and a second portion, with the first portion having a plurality of through-silicon vias in electrical contact with the plurality of connections of the substrate. The second portion is positioned adjacent the first portion and has an absence of through-hole silicon vias. A plurality of integrated circuit dies are disposed above the silicon interposer and laterally adjacent each other, with each die in electrical contact with one or more of the plurality of through-silicon vias which are adapted to serve as interconnects between the dies and the substrate. A least a portion of one of the plurality of dies is disposed above and supported by the second portion of the silicon interposer.

In accordance with another embodiment, there is provided a multi-die integrated circuit assembly including a substrate having a plurality of interconnect conductors and an interposer substrate disposed above the substrate. The interposer substrate has a centrally positioned first portion and a second portion adjacent the first portion. The first portion includes a plurality of through-silicon vias and a plurality of interconnect conductors, and the second portion has an absence of through-hole silicon vias and interconnect conductors. The assembly further includes a first plurality of connections electrically coupling the interconnect conductors of the substrate with the plurality of through-silicon vias. A plurality of integrated circuit dies are disposed above the interposer substrate and laterally adjacent from each other, with each die in electrical contact with one or more of the plurality of through-silicon vias, with the through-silicon vias adapted to serve as interconnects between the dies and the substrate. A second plurality of connections electrically couples each of the plurality of through-silicon vias with each of the plurality of dies, respectively. At least a portion of one of the plurality of dies extends beyond a periphery of the first portion of the interposer substrate.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION

Figure 1:
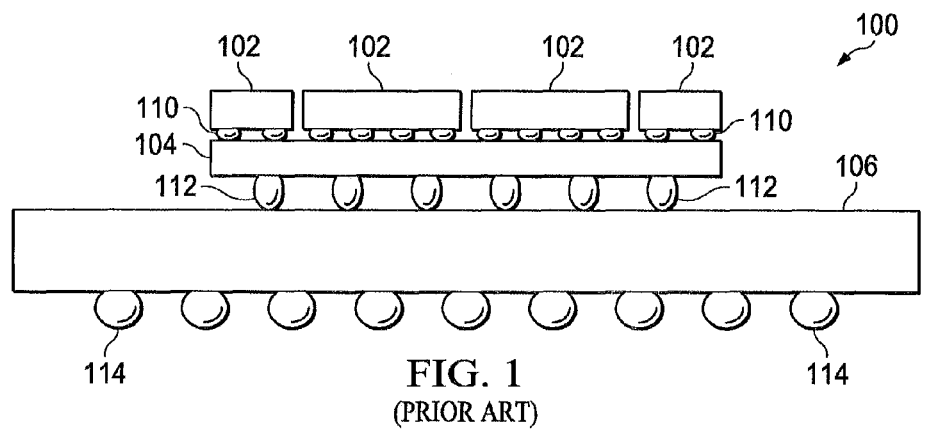
FIG. 1 depicts a prior art multi-die package structure.

In general terms, the present disclosure describes and teaches the design and construction of a new 2.5D IC package assembly that enables a larger overall package size through the use of a larger sized silicon interposer having a conventional sized "active area." As shown in FIG. 1, the prior art is limited to the inclusion of dies mounted on the silicon interposer that have a combined total area that is less than the area of the silicon interposer. Thus, if a die is large, its combinability with other dies into a 2.5D IC package assembly is limited. By aligning only portions of the plurality of dies over the "active area", larger dies and/or a higher number of dies may be combined and assembled into a single package.

For purposes of this patent document, the term "active area" of a silicon interposer refers to the area in which TSVs and other interconnect conductors (for power, ground, and other signals) are present and formed using photolithography reticles (also referred to as photomasks).

Figure 2A:
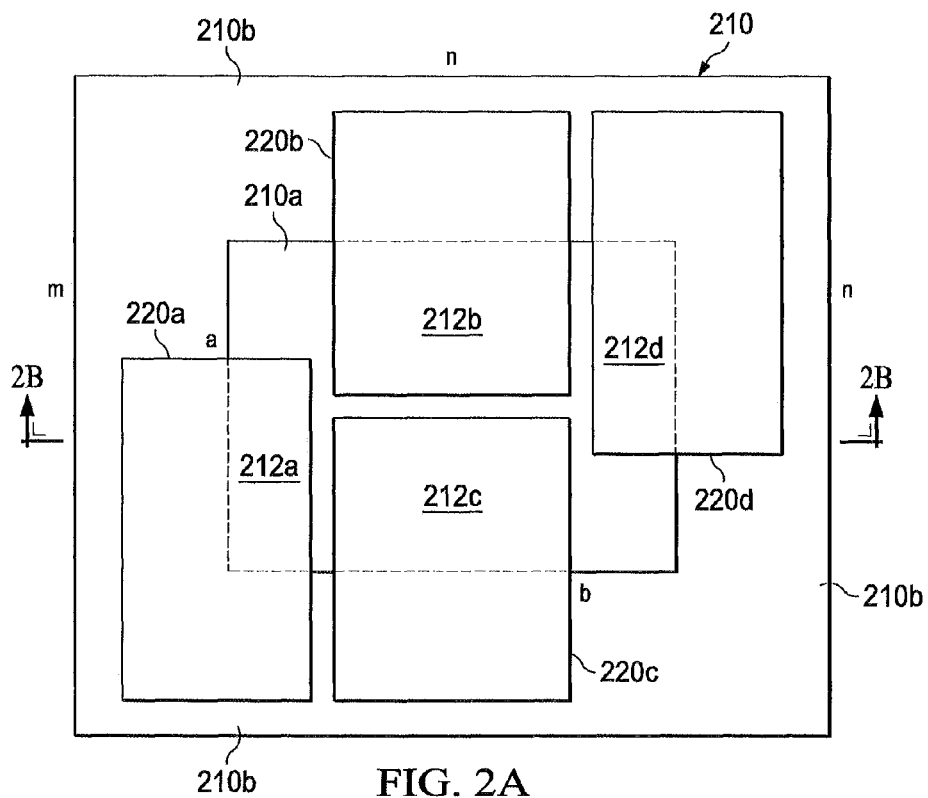
FIGS. 2A and 2B depict an example multi-die integrated circuit assembly in accordance with the present disclosure.
Figure 2B:
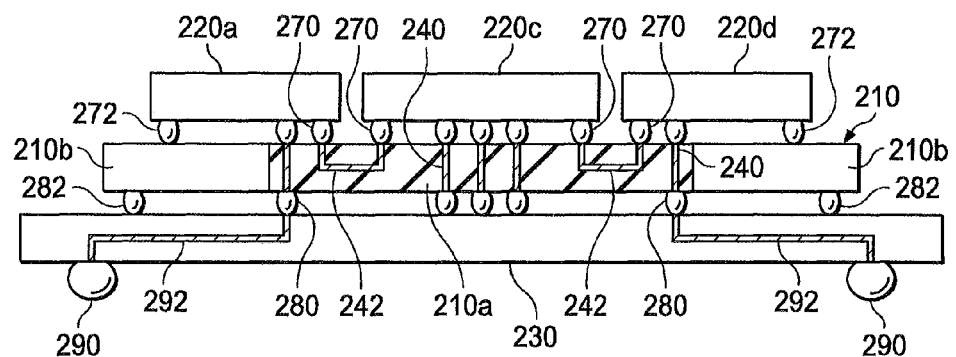

Now turning to FIGS. 2A and 2B, there are depicted a top view and a cross-sectional view (along line B-B), respectively, of a example multi-die integrated circuit assembly 200 in accordance with the present disclosure.

The assembly 200 includes an interposer structure 210 having a first portion 210a and a second portion 210b. A plurality of integrated circuit dies 220 (220a through 220d) are disposed above and mounted on the interposer structure 210, as shown, and are electrically connected to the interposer structure 210 through conductive connections 270. The connections 270 are readily known to those of skill in the art, and may be configured as bumps, microbumps, or some other conductive structure(s). The interposer structure 210 may be constructed of any suitable material(s) capable of providing TSVs and other interconnect conductors extending therein. In one embodiment, the interposer structure 210 is constructed of silicon.

Optional support structures 272 may be included between the dies 220 and the silicon interposer 210 for supporting portions of the dies 220 which extend beyond the outer periphery of the first portion 210a of the silicon interposer 210. The support structures may be configured or constructed as bumps, microbumps, or some other structure(s). In one embodiment, the structures 272 are the same as the connections 270 for ease of manufacturing and assembly. As will be appreciated, in one embodiment, the structures 272 may be referred to as "dummy" bumps or dummy connections. In another embodiment, the dummy connections 272 are electrically isolated from power, ground and signal paths in the dies 220.

The silicon interposer 210 is disposed above and mounted on a substrate 230, as shown, and is electrically coupled to the substrate 230 through conductive connections 280. The connections 280 are readily known to those of skill in the art, and may be configured as bumps (e.g., C4 bumps) or some other conductive structure(s). Beneath the substrate 230 are multiple connections 290 which are readily known to those of skill in the art, and may be configured as solder balls or some other conductive structure(s). Various interconnect conductors 292 are disposed within the substrate 230 and provide electrical connectivity between the connections 280 and the connections 290.

Similar to the support structures 272, optional support structures 282 may be included between the silicon interposer 210 and the substrate 230 for supporting portion(s) of the silicon interposer 210 that extend beyond the outer periphery of the first portion 210a of the silicon interposer 210. The support structures 282 may be configured or constructed as bumps or some other structure(s). In one embodiment, the structures 282 are the same as the connections 280 for ease of manufacturing and assembly. As will be appreciated, in one embodiment, the structures 282 may be referred to as "dummy" bumps or dummy connections. In another embodiment, the dummy connections 282 are electrically isolated from conductive paths in the silicon interposer 210 and the substrate 230.

Formed and situated within the first portion 210a of the silicon interposer 210 are multiple TSVs 240 and multiple interconnect conductors or pathways 242 (though only a few are shown). The TSVs 240 and interconnect conductors 242 are configured and structured to provide a desired interconnect pattern or matrix between and among the plurality of dies 220, and between the plurality of dies 220 and the substrate 230. The first portion 210a (or area) is referred to as the "active area" of the interposer 210. In contrast, the first portion 210b of the silicon interposer 210 does not include any TSVs or other conductors (i.e., absence of these structures) configured for connection to the dies 220 or the substrate 230.

Referring to FIG. 2A, the silicon interposer 210 is shown with dimensions m×n. The first portion 210a has dimensions a×b, which defines a subarea of the entire m×n area. The a×b dimensions define the active area (portion 210a) and also correspond substantially to the size of reticle(s) used in the manufacturing process to form the TSVs 240 and interconnect conductors 242 within the active area. In the prior art, the area size of a silicon interposer was limited by the a×b dimensions—the size of the reticle(s).

In accordance with the present disclosure, one or more of the multiple dies 220 are configured to have their power/ground and external I/O signal line connections concentrated within an area of the die 220. For example, the dies 220a, 220b, 220c and 220d have their power/ground and external I/O signal line connections within areas 212a, 212b, 212c and 212d, respectively (which are within the portion 210a of the a×b area). Each of the dies is arranged within the assembly 200 so these connections (bumps) are allocated in such a way that all the connections (bumps) are within the first portion 210a (defined by the area a×b, as shown in FIG. 2A). As previously described, the TSVs 240 and interconnect conductors 242 are all fabricated in this active area/portion of the silicon interposer 210 (portion 210a). As a result, the size of the entire silicon interposer 210 can be considered as large as m×n, but the effective/active area (a×b) can be smaller—which is manufacturable using current technology.

In various embodiments, each of the dies 220 have their respective power/ground and I/O signal lines concentrated within first areas 212a, 212b, 212c and 212d of the dies 220, respectively, and the size/magnitude of each first area is substantially less than the overall area of the respective die. Herein, a first area is substantially less than the die's overall area when the first are is about 75% or less than the overall area. In other embodiments, the first area may be on the order of 60%, 50%, 40%, 30%, or even 20% of the overall area.

Figure 3:
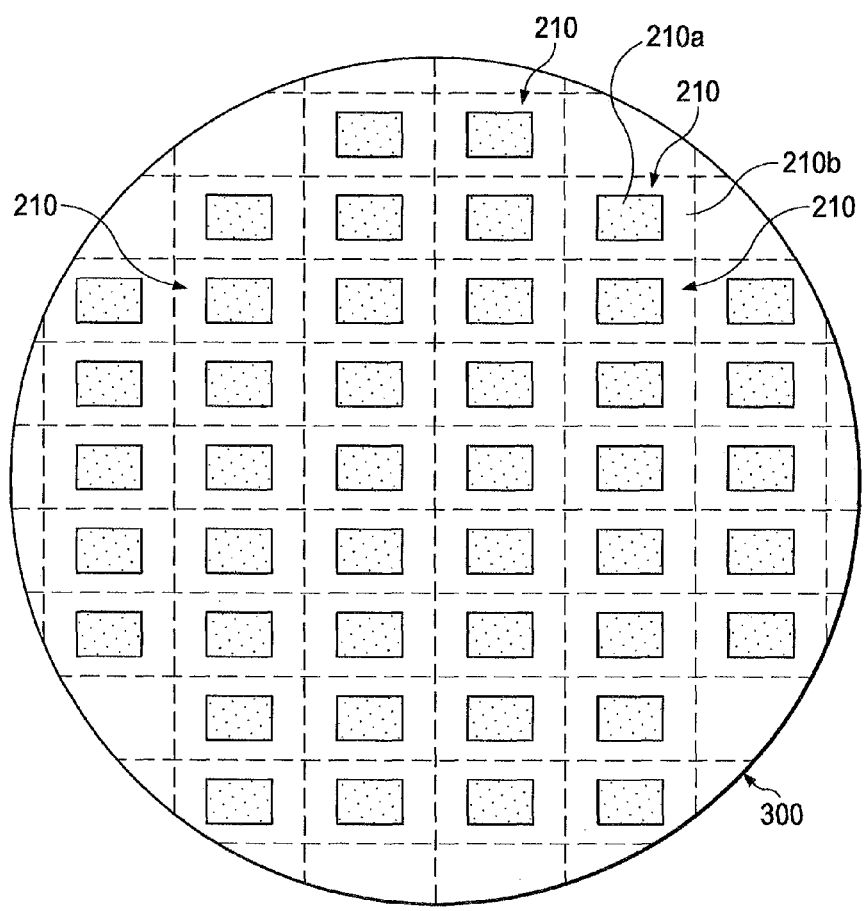
FIG. 3 depicts a wafer including multiple silicon interposers prior to dicing.

Now turning to FIG. 3, there is illustrated a silicon wafer 300 including multiple silicon interposers 210 formed thereon. As will be appreciated, the fabrication process to form the TSVs 240 and interconnect conductors 242 is applied only to the first portions 210a of each interposer 210. As will be appreciated, conventional process(es) are performed, as is known in the art, to construct the silicon interposer 210 with the desired pattern of TSVs 240 and interconnect conductors 242. After fabrication, the wafer 300 is then diced along the dotted lines.

Now turning back to FIG. 2B, the TSVs 240 and the interconnect conductors 242 (not all shown) are concentrated in the first portion 210a, and the power/ground and external I/O lines are dispersed through the package substrate 230.

For purposes of clarity, not all elements within the assembly 200 are shown or described, and only those elements necessary for an understanding of the present disclosure are shown. In other embodiments, one or more of the dies 220 may be a 2D integrated circuits (2D IC), a 2D IC package, a 3D integrated circuit (3D IC) or a 3D IC package, or any combination of the foregoing.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A multi-die integrated circuit assembly, comprising:
   a substrate having a plurality of connections;
   a silicon interposer disposed above the substrate, the silicon interposer having a first portion and a second portion, the first portion comprising a plurality of through-silicon vias in electrical contact with the plurality of connections of the substrate, the second portion positioned adjacent the first portion and having an absence of through-hole silicon vias;
   a plurality of integrated circuit dies disposed above the silicon interposer and laterally adjacent each other, each die in electrical contact with one or more of the plurality of through-silicon vias, wherein the through-silicon vias are adapted to serve as interconnects between the dies and the substrate; and
   wherein at least a portion of one of the plurality of dies is disposed above and supported by the second portion of the silicon interposer.

2. The multi-die assembly in accordance with claim 1 further comprising:
   a plurality of first support members disposed between the second portion of the silicon interposer and the portion of one of the plurality of dies supported by the second portion of the silicon interposer.

3. The multi-die assembly in accordance with claim 1 wherein the first portion of the silicon interposer further comprises:
   a plurality of interconnect conductors in electrical contact with the one or more of the plurality of dies, and wherein the second portion having an absence of interconnect conductors.

4. The multi-die integrated circuit assembly in accordance with claim 1 wherein at least one of the plurality of dies comprises a 2D integrated circuit die.

5. The multi-die integrated circuit assembly in accordance with claim 1 wherein at least one of the plurality of dies comprises a 3D integrated circuit.

6. The multi-die integrated circuit assembly in accordance with claim 1 wherein each of the plurality of dies overlaps the first portion of the silicon interposer and overlaps the second portion of the silicon interposer.

7. The multi-die integrated circuit assembly in accordance with claim 1 wherein each of the plurality of dies has their respective power/ground and I/O signal lines concentrated within a first area of the die which is substantially less than the total area of the die.

8. A multi-die integrated circuit assembly, comprising:
   a substrate having a plurality of interconnect conductors;
   an interposer substrate disposed above the substrate, the interposer substrate having a centrally positioned first portion and a second portion adjacent the first portion, the first portion comprising a plurality of through-silicon vias and a plurality of interconnect conductors, and wherein the second portion has an absence of through-hole silicon vias and interconnect conductors;
   a first plurality of connections electrically coupling the interconnect conductors of the substrate with the plurality of through-silicon vias;
   a plurality of integrated circuit dies disposed above the interposer substrate and laterally adjacent from each other, each die in electrical contact with one or more of the plurality of through-silicon vias, wherein the through-silicon vias are adapted to serve as interconnects between the dies and the substrate;
   a second plurality of connections electrically coupling each of the plurality of through-silicon vias with each of the plurality of dies, respectively; and
   wherein at least a portion of one of the plurality of dies extends beyond a periphery of the first portion of the interposer substrate.

9. The multi-die assembly in accordance with claim 8 further comprising:
   a support member disposed on the second portion of the interposer substrate and configured for supporting the portion of the one of the plurality of dies extending beyond the first portion of the interposer substrate.

10. The multi-die assembly in accordance with claim 9 further comprising:
    a second support member disposed on the substrate and configured for supporting the second portion of the interposer substrate.

11. The multi-die assembly in accordance with claim 8 further comprising:
    a third plurality of connections, the third plurality of connections comprising a first connection and a second connection for electrically coupling a one of the plurality of interconnect conductors in the interposer substrate to a first die and to a second die, respectively.

12. The multi-die integrated circuit assembly in accordance with claim 8 wherein the interposer substrate comprises silicon.

13. The multi-die integrated circuit assembly in accordance with claim 8 wherein each of the plurality of dies overlaps the first portion of the interposer substrate and overlaps the second portion of the interposer substrate.

14. The multi-die integrated circuit assembly in accordance with claim 8 wherein each of the plurality of dies has its respective power/ground and I/O signal lines concentrated within a first area of the die which is substantially less than the total area of the die.

* * * * *

UNITED STATES PATENT AND TRADEMARK OFFICE
CERTIFICATE OF CORRECTION

Page 1 of 1

PATENT NO.         : 8,519,543 B1
APPLICATION NO.    : 13/551466
DATED              : August 27, 2013
INVENTOR(S)        : Haoyu Song et al.

It is certified that error appears in the above-identified patent and that said Letters Patent is hereby corrected as shown below:

Title page, item (75) Inventors: correct the second joint inventor to -- Wei Cao --

Signed and Sealed this
Fifteenth Day of December, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,519,543 B1 | Page 1 of 1 |
| APPLICATION NO. | : 13/551466 | |
| DATED | : August 27, 2013 | |
| INVENTOR(S) | : Haoyu Song et al. | |

It is certified that error appears in the above-identified patent and that said Letters Patent is hereby corrected as shown below:

TITLE PAGE:

Item (75) Inventors: correct the second joint inventor to --Wei Cao--
(as corrected to read in the Certificate of Correction issued December 15, 2015) is deleted and patent is returned to its original state with the Inventors name in patent to read --Cao Wei, Cupertino, CA (US)--

Signed and Sealed this
Eighth Day of March, 2016

Michelle K. Lee
*Director of the United States Patent and Trademark Office*